United States Patent
Kryliouk et al.

(10) Patent No.: US 8,946,674 B2
(45) Date of Patent: Feb. 3, 2015

(54) GROUP III-NITRIDES ON SI SUBSTRATES USING A NANOSTRUCTURED INTERLAYER

(75) Inventors: Olga Kryliouk, Gainesville, FL (US); Hyun Jong Park, Gainesville, FL (US); Timothy J. Anderson, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 365 days.

(21) Appl. No.: 11/512,615

(22) Filed: Aug. 29, 2006

(65) Prior Publication Data

US 2007/0108466 A1 May 17, 2007

Related U.S. Application Data

(60) Provisional application No. 60/712,922, filed on Aug. 31, 2005.

(51) Int. Cl.
*H01L 29/12* (2006.01)
*H01L 21/02* (2006.01)

(52) U.S. Cl.
CPC .... *H01L 21/02658* (2013.01); *H01L 21/02381* (2013.01); *H01L 21/02458* (2013.01); *H01L 21/02502* (2013.01); *H01L 21/02513* (2013.01); *H01L 21/0254* (2013.01); *H01L 21/0262* (2013.01)
USPC .................. 257/11; 257/14; 257/18

(58) Field of Classification Search
USPC .............................. 257/18, 11, 14
See application file for complete search history.

(56) References Cited

U.S. PATENT DOCUMENTS

| 5,310,596 | A | 5/1994 | Bigelow et al. |
| 5,981,400 | A | 11/1999 | Lo |
| 6,022,622 | A | 2/2000 | Domoto et al. |
| 6,086,673 | A | 7/2000 | Molnar |
| 6,238,980 | B1 | 5/2001 | Ueno |

(Continued)

FOREIGN PATENT DOCUMENTS

| CA | 2493503 | 4/1999 |
| EP | 1246233 A2 | 10/2002 |

(Continued)

OTHER PUBLICATIONS

Amano et al. "Group III Nitride-Based UV Light Emitting Devices", Phys. Stat. Sol. (a), 2003, vol. 195, No. 3, pp. 491-495.

(Continued)

*Primary Examiner* — Samuel Gebremariam
(74) *Attorney, Agent, or Firm* — Cantor Colburn LLP (57) ABSTRACT

A layered group III-nitride article includes a single crystal silicon substrate, and a highly textured group III-nitride layer, such as GaN, disposed on the silicon substrate. The highly textured group III-nitride layer is crack free and has a thickness of at least 10 μm. A method for forming highly textured group III-nitride layers includes the steps of providing a single crystal silicon comprising substrate, depositing a nanostructured $In_xGa_{1-x}N$ (1≥x≥0) interlayer on the silicon substrate, and depositing a highly textured group III-nitride layer on the interlayer. The interlayer has a nano indentation hardness that is less than both the silicon substrate and the highly textured group III-nitride layer.

12 Claims, 6 Drawing Sheets

(56) References Cited

U.S. PATENT DOCUMENTS

| | | | |
|---|---|---|---|
| 6,339,257 B1 | 1/2002 | Fujiki | |
| 6,376,339 B2 | 4/2002 | Linthicum et al. | |
| 6,406,540 B1 | 6/2002 | Harris et al. | |
| 6,423,983 B1 | 7/2002 | Narayan et al. | |
| 6,447,604 B1 | 9/2002 | Flynn et al. | |
| 6,472,300 B2 | 10/2002 | Nikolaev et al. | |
| 6,476,420 B2 | 11/2002 | Nikolaev et al. | |
| 6,479,839 B2 | 11/2002 | Nikolaev et al. | |
| 6,518,077 B2 | 2/2003 | Narayan et al. | |
| 6,555,452 B2 | 4/2003 | Nikolaev et al. | |
| 6,559,038 B2 | 5/2003 | Nikolaev et al. | |
| 6,559,467 B2 | 5/2003 | Nikolaev et al. | |
| 6,596,377 B1 | 7/2003 | Hersee et al. | |
| 6,599,133 B2 | 7/2003 | Nikolaev et al. | |
| 6,610,144 B2 | 8/2003 | Mishra et al. | |
| 6,617,060 B2 * | 9/2003 | Weeks et al. | 428/698 |
| 6,630,690 B2 | 10/2003 | Edmond et al. | |
| 6,649,287 B2 | 11/2003 | Weeks, Jr. et al. | |
| 6,649,942 B2 | 11/2003 | Hata et al. | |
| 6,692,568 B2 | 2/2004 | Cuomo et al. | |
| 6,720,196 B2 | 4/2004 | Kunisato et al. | |
| 6,773,946 B2 | 8/2004 | Moon et al. | |
| 6,784,085 B2 | 8/2004 | Cuomo et al. | |
| 6,812,508 B2 | 11/2004 | Fukumi | |
| 6,812,518 B2 | 11/2004 | Miida | |
| 6,818,061 B2 | 11/2004 | Peczalski et al. | |
| 6,844,569 B1 | 1/2005 | Lee et al. | |
| 6,849,862 B2 | 2/2005 | Nikolaev et al. | |
| 6,958,254 B2 | 10/2005 | Seifert | |
| 6,967,346 B2 | 11/2005 | Chien et al. | |
| 7,102,173 B2 | 9/2006 | Yi et al. | |
| 7,132,677 B2 | 11/2006 | Kim et al. | |
| 7,339,205 B2 | 3/2008 | Piner et al. | |
| 7,396,696 B2 | 7/2008 | Kim et al. | |
| 2001/0023942 A1 | 9/2001 | Kim et al. | |
| 2002/0013042 A1 | 1/2002 | Morkoc | |
| 2002/0017650 A1 | 2/2002 | Nikolaev et al. | |
| 2002/0047135 A1 | 4/2002 | Nikolaev et al. | |
| 2002/0136932 A1 | 9/2002 | Yoshida | |
| 2003/0155574 A1 | 8/2003 | Doolittle | |
| 2003/0213964 A1 | 11/2003 | Flynn et al. | |
| 2003/0232455 A1 | 12/2003 | Tanaka et al. | |
| 2004/0061119 A1 | 4/2004 | Inoue et al. | |
| 2004/0077156 A1 | 4/2004 | Tsakalakos et al. | |
| 2004/0137732 A1 | 7/2004 | Frayssinet et al. | |
| 2005/0051766 A1 | 3/2005 | Stokes et al. | |
| 2005/0067935 A1 | 3/2005 | Lee et al. | |
| 2005/0142391 A1 | 6/2005 | Dmitriev et al. | |
| 2005/0164419 A1 | 7/2005 | Hirota et al. | |
| 2005/0179052 A1 | 8/2005 | Yi et al. | |
| 2005/0194598 A1 | 9/2005 | Kim et al. | |
| 2005/0199886 A1 | 9/2005 | Yi et al. | |
| 2005/0230673 A1 | 10/2005 | Mueller et al. | |
| 2006/0006500 A1 | 1/2006 | Piner et al. | |
| 2006/0091408 A1 | 5/2006 | Kim et al. | |
| 2007/0045660 A1 | 3/2007 | Yi et al. | |
| 2007/0077670 A1 | 4/2007 | Kim et al. | |
| 2008/0157057 A1 | 7/2008 | Kim | |
| 2008/0185604 A1 | 8/2008 | Kim | |
| 2008/0191191 A1 | 8/2008 | Kim | |
| 2008/0280426 A1 | 11/2008 | Li et al. | |
| 2008/0283821 A1 | 11/2008 | Park et al. | |
| 2009/0243043 A1 | 10/2009 | Wang | |

FOREIGN PATENT DOCUMENTS

| | | |
|---|---|---|
| EP | 1422748 A1 | 5/2004 |
| JP | 11186178 A | 7/1999 |
| JP | 2002164521 A | 6/2002 |
| JP | 2003022973 A | 1/2003 |
| JP | 2003243316 A | 8/2003 |
| JP | 2004289095 A | 10/2004 |
| JP | 20050019 | 1/2005 |
| JP | 2005183917 | 7/2005 |
| WO | 9914797 | 3/1999 |
| WO | 9919546 | 4/1999 |
| WO | 0245140 A2 | 6/2002 |
| WO | 2004057663 A1 | 7/2004 |
| WO | 2005024952 A2 | 3/2005 |
| WO | 2005094271 A2 | 10/2005 |
| WO | 2007001098 A1 | 1/2007 |
| WO | 2007001099 A1 | 1/2007 |
| WO | 2007007954 A1 | 1/2007 |
| WO | 2007021017 A1 | 2/2007 |
| WO | 2007021047 A1 | 2/2007 |
| WO | 2007021069 A1 | 2/2007 |
| WO | 2007032802 A2 | 3/2007 |
| WO | 2008002104 A1 | 1/2008 |

OTHER PUBLICATIONS

Amano et al. "Defect and Stress Control of AlGaN for Fabrication of High Performance UV Light Emitters", Phys. Stat. Sol. (a), 2004, vol. 201, No. 12, pp. 2679-2685.

Amano et al. "Novel Aspects of the Growth of Nitrides by MOVPE", J. Phys. Condens. Matter, 2001, vol. 13, pp. 6935-6944.

Akasaki "Progress in Crystal Growth of Nitride Semiconductors", Journal of Crystal Growth, 2000, vol. 221, pp. 231-239.

Chen et al, "A Study of Surface and Interlayer Structures of Epitaxially Grown Group-III Nitride Compound Films on Si(111) Substrates by Second-Harmonic Generation", J. Phys. Condens. Matter., 2003, vol. 15. pp. 6537-6548.

Akasaki "The Evolution of Group III Nitride Semiconductors; Seeking Blue Light Emission" Materials Science and Engineering(2000) pp. 101-106.

Akasaki "Renaissance and Progress in Nitride Semiconductors—My Personal History of Nitride Research" Material Research Soc. Symposium (2001) pp. G8. 1.1-G8. 1. 12; vol. 639.

Amano, et al. "Improvement of Crystalline Quality of Group III Nitrides on Sapphire using Low Temperature Interlayers" MRS Internet J. Nitride Semiconductor Res. 4S1, G10.1 (1999).

Hersee, et al. "Nanoheteroepitaxy for the Integration of Highly Mismatched Semiconductor Materials" IEEE J. Quantum Electronics (2002); pp. 1017-1028; vol. 38, No. 8.

Kikuchi, et al. "InGaN/GaN Multiple Quantum Disk Nanocolumn Light-Emitting Diodes Grown on (111) Si Substrate" Jap. J. App. Phys. (2004) pp. L1524-L1526; vol. 43, No. 12A.

Kusakebe, et al. "Characterization of Overgrown GaN Layers on Nano-Columns Grown by RF-Molecular Beam Epitaxy" Jap. J. App. Phys. (2001) pp. L192-L194; vol. 40, No. 3A.

Liang, et al. "Nanoheteroepitaxy of GaN on a Nanopore Array Si Surface" App. Phys. Lett. (2003) pp. 1752-1754; vol. 83, No. 9.

Qian, et al. "Core/Multishell Nanowire Heterostructures as Multicolor, Hig-Efficiency Light-Emitting Diodes" Nano Letters (2005) pp. 2287-2291; vol. 5, No. 11.

Richter, et al. "Growth Optimization for Thich Crack-Free GaN Layers on Sapphire with HVPE"; Phys. Stat. Sol. (c) (2005) pp. 2099-2103, vol. 2, No. 7.

K.Y. Zang, et al. "Nanoheteroepitaxy of GaN on a Nanopore Array of Si (111) Surface" Thin Solid Films (2007); pp. 4505-4508; vol. 515 Science Direct; Elsevier B.V.

D Zubia, et al. "Nanoheteroepitaxial Growth of GaN on Si by Organometallic Vapor Phase Epitaxy" App. Phys. Ltrs. (Feb. 14, 2000) pp. 858-860; vol. 76; No. 7; American Institute of Physics.

M.E. Aumer, et al. "Effects of Tensile, Compressive, and Zero Strain on Localized States in AlInGaN/InGaN Quantum-Well Structures" Applied Physics Letters (Apr. 29, 2002); pp. 3099-3101; vol. 80, No. 17.

C-L Wu, et al. "Heteroepitaxy of GaN on Si(111) Realized with a Coincident-Interface AlN/B—Si3N4(0001) Double-Buffer Structure" Applied Physics Letters (Dec. 1, 2003); pp. 4530-4532; vol. 83, No. 22; American Institute of Physics.

L. Dobos, et al. "Microstructure of GaN Layers Grown on Si(111) Revealed by TEM" Vacuum (2003); pp. 285-291; vol. 71; Vacuum Surface Engineering, Surface Instrumentation and Vacuum Technology; Pergamon; Elsevier Science, Ltd.

(56) References Cited

OTHER PUBLICATIONS

E. Feltin, et al. "Crack-free Thick GaN Layers on Silicon (111) by Metalorganic Vapor Phase Epitaxy" Phys.stat.sol (a) (2001); pp. 531-535; vol. 188, No. 2; Wiley-VCH Verlag Berlin GmbH.

FR Hu, et al. "A 100 nm Thick InGaN/GaN Multiple Quantum-well Column-crystallized Thin Film Deposited on Si (111) Substrate and its Micromachining" Nanotechnology 19 (2008) 035305; 6 pages; IOP Publishing.

O. Gfrorer, et al. "Investigations of Selectively Grown GaN/InGaN Epitaxial Layers" Materials Science and Engineering B50 (1997) pp. 268-271; Elsevier.

G-M Wu, et al. "Investigation of GaN Crystal Quality on Silicon Substrates Using GaN/AlN Superlattice Structures" Cryst. Res. Technol. (2007) pp. 1276-1280; vol. 42, No. 12; Wiley-VCH.

S. Gu, et al. "The Impact of Initial Growth and Substrate Nitridation on Thick GaN Growth on Sapphire by Hydride Vapor Phase Epitaxy" Journal of Crystal Growth 231 (2001); pp. 342-351; Elsevier.

Y He, et al. "Optically Pumped Ultraviolet AlGaInN Quantum Well Laser at 340 nm Wavelength" Applied Physics Letters (Jan. 26, 2004); pp. 463-465; vol. 84, No. 4; American Institute of Physics.

Hiramatsu, et al. "Selective Area Growth and Epitaxial Lateral Overgrowth of GaN by Metalorganic Vapor Phase Epitaxy and Hydride Vapor Phase Epitaxy" Materials Science and Engineering B59 (1999); pp. 104-111; Elsevier.

K Hiramatsu, et al. "Fabrication and Characterization of Low Defect Density GaN Using Facet-controlled Epitaxial Lateral Overgrowth (FACELO)" Journal of Crystal Growth 221 (2000); pp. 316-326; Elsevier.

HJ Park, et al. "Morphological Study of InN Films and Nanorods Grown by H-MOVPE" Mater.Res.Soc.Proc. vol. 892 (2006) 6 pages; Materials Research Society.

HJ Park, et al. "Growth of InN Films and Nanorods by H-MOVPE" Physica E 37 (2007) pp. 142-147; Science Direct; Elsevier B.V.

HM Kim, et al. "InGaN Nanorods Grown on (111) Silicon Substrate by Hydride Vapor Phase Epitaxy" Chemical Physics Letters 380 (2003) pp. 181-184; Elsevier B.V.

Y Honda, et al. "Selective Area Growth of GaN Microstructures on Patterned (111) and (001) Si Substrates" Journal of Crystal Growth 230 (2001); pp. 346-350; Elsevier.

J. Wu, et al. "Crack-free GaN/Si(111) Epitaxial Layers Grown with InAlGaN Alloy as Compliant Interlayer by Metalorganic Chemical Vapor Deposition" Journal of Crystal Growth (2005); pp. 335-340; vol. 279; Science Direct; Elsevier B.V.

J. Wu, et al. "Crack-free InAlGaN Quaternary Alloy Films Grown on Si(111) Substrate by MEtalorganic Chemical Vapor Deposition" (2004) Journal of Crystal Growth (2004); pp. 79-85; vol. 273; Science Direct; Elsevier B.V.

S. Joblot, et al. "Hexagonal c-axis GaN Layers Grown by Metalorganic Vapor-phase Epitaxy on Si (001)" Journal of Crystal Growth 280 (2005) pp. 44-53; Science Direct; Elsevier.

K. Kusakabe, et al. "Overgrowth of GaN Layer on GaN Nano-columns by RF-molecular Beam Epitaxy" Journal of Crystal Growth 237-239 (2002) pp. 988-992; Elsevier Science B.V.

H. Kang, et al. "Reduction of Threading Dislocation Density in AlGaN by Indium Incorporation" Mat.Res.Soc.Symp. Proc Vo. 798 (2004) 6 pages: pp Y5.71.1-Y5.71.6; Materials Research Society.

YH Kim, et al. "Indium-related Novel Architecture of GaN Nanorod Grown by Molecular Beam Epitaxy" Chemical Physics Letters 412 (2005) pp. 454-458; Science Direct; Elsevier B.V.

O. Kryliouk, et al. "Pt-coated InN Nanorods for Selective Detection of Hydrogen at Room Temperature" J.Vac.Sci. Technol.B 23 (5) Sep./Oct. 2005; pp. 1891-1894.

O. Kryliouk, et al. "Controlled Synthesis of Single-crystalline InN Nanorods" Nanotechnology 18 (2007) 135606 (6 pages); IOP Publishing.

KW Kim, et al. "Reduction of Dislocation in GaN Epitaxial Layer Grown on (111)-oriented Silicon by Using InN Inter-layer" ECS Meeting (May 26, 2009) ABS No. 893; San Francisco, CA (1 page).

H. Lahreche, et al. "Growth of GaN on (111) Si: A Route Towards Self-Supported GaN" Journal of Crystal Growth 231 (2001) pp. 329-334; Elsevier B.V.

Z.H. Lan, et al. "Growth Mechanism, Structure and IR Photoluminescence Studies of Indium Nitride Nanorods" Journal of Crystal Growth 269 (2004) pp. 87-94; Science Direct; Elsevier B.V.

Z. Liliental-Weber, et al. "InN Nanorods and Epi-layers: Similarities and Differences" Microscopy of Semiconducting Materials (2007) pp. 37-40; vol. 120; Springer Proceedings in Physics.

Z. Liu, et al. "Effects of Buffer Layers on the Stress and Morphology of GaN Epilayer Grown on Si Substrate by MOCVD" Journal of Crystal Growty 298 (2007) pp. 281-283; Science Direct; Elsevier B.V.

M.H. Kim, et al. "Effects of Step-graded $Al_xGa1-xN$ Interlayer on Properites of GaN Grown on Si(111) Using Ultrahigh Vacuum Chemical Vaport Deposition" Applied Physics Letters (Oct. 22, 2001) pp. 2713-2715; vol. 79, No. 17; American Institute of Physics.

MA Mastro, et al. "Oxynitride Mediated Epitaxy of Gallium Nitride on Silicon (111) Substrates in a Merged Hydride/Metal-Organic Vapor Phase Epitaxy System" Materials Science and Engineering B 127 (2006) pp. 91-97; Elsevier B.V.

A. Mills "Compound Semiconductors on Silicon" III-Vs Review (May 2002) vol. 15, No. 4 pp. 30-35; The Advanced Semiconductor Magazine.

C.C. Mitchell, et al. "Mass Transport in the Epitaxial Lateral Overgrowth of Gallium Nitride" Journal of Crystal Growth 222 (2001) pp. 144-153; Elsevier.

H. Naoi, et al. "Epitaxial Lateral Overgrowth of GaN on Selected-Area Si(111) Substrate with Nitrided Si Mask" Journal of Crystal Growth 248 (2003) pp. 573-577; Science Direct; Elsevier B.V.

F.R. Hu, et al. "A 100 nm Thick InGaN/GaN Multiple Quantum-well Column-crystallized Thin Film Deposited on Si (111) Substrate and its Micromachining" Nanotechnology 19 (2008); 035305; 6 pages; IOP Publishing.

O. Kryliouk, et al. "Growth of GaN Single Crystal Substrates" Materials Science and Engineering B59 (1999) pp. 6-11; Elsevier Science S.A.

Memorandum: From: Phil Alden To: David Rodrigues (Mar. 10, 2010) Subject: "UFL Kryliouk '615 and '567 Patent Applications" Received by Cantor Colburn LLP Mar. 15, 2010; Applied Materials, 2881 Scott Blvd. M/S 2065; Santa Clara CA 95052 (9 pages).

FA Ponce, et al. "Microstructure of InGaN Quantum Wells" Mat. Res. Soc. Symp. Proc. vol. 482; pp. 453-458; Materials Research Society.

L.A. Reichertz, et al. "InGaN Thin Films Grown by ENABLE and MBE Techniques on Silicon Substrates" Mater. Res. Soc. Symp. Proc. (2008) vol. 1068; 6 pages; Materials Research Society.

H. Selke, et al. "Compositional Inhomogeneities in InGaN Studied by Transmission Electron Microscopy and Spatially Resolved Cathodolumniescence" Materials Science and Engineering B59 (1999) pp. 279-282; Elsevier.

SH Jang, et al. "High-Quality GaN/Si (111) Epitaxial Layers Grown with Various Al 0.3Ga0.7N/GaN Superlattices as Intermediate Layer by MOCVD" Journal of Crystal Growth 253 (2003) pp. 64-70; Science Direct; Elsevier.

T. Shibata, et al. "Hydride Vapor-Phase Epitaxy Growth of High-Quality GaN Bulk Single Crystal by Epitaxial Lateral Overgrowth" Journal of Crystal Growth (1998) pp. 67-71; vol. 189; Elsevier B.V.

Siegle, et al. "Vertical Strain and Doping Gradients in Thick GaN Layers" Appl. Phys. Lett. (1997) pp. 2490-2492; vol. 71, No. 17.

D. Simeonov, et al. "Strain Relaxation of AlN Epilayers for Stranski-Krastanov GaN/AlN Quantum Dots Grown by Metal Organic Vapor Phase Epitaxy" Journal of Crystal Growth (2007) pp. 254-258; vol. 299; Science Direct; Elsevier B.V.

A. Syrkin, et al. "InN Nano Rods and Epitaxial Layers Grown by HVPE on Sapphire Substrates and GaN, AlGaN, AlN Templates" Mater.Res.Symp.Proc. vol. 892 (2006) (4 pages) Materials Research Society.

T-Y Tang, et al. "Coalescence Overgrowth of GaN Nano-columns with Metalorganic Chemical Vapor Deposition" Nanotechnology (2007) vol. 18; 445601(4 pages); IOP Publishing.

(56) References Cited

OTHER PUBLICATIONS

AP Vajpeyi, et al. "InGaN Nanopillars Grown on Silicon Substrate Using Plasma Assisted Molecular Beam Epitaxy" Nanotechnology (2009) vol. 20; 325605 (5 pages); IOP Publishing.

YS Won, et al. "Growth Mechanism of Catalyst-and Template-Free Group III Nitride Nanorods" Journal of Crystal Growth (2008) pp. 3735-3740; vol. 310; Science Direct: Elsevier B.V.

A. Yamamoto, et al. "Formation of 'Air-gap' Structure at a GaN Epilayer/Substrate Interface by Using an InN Interlayer" Phys.Stat. Sol (c) (2003); pp. 2826-2829; No. 7; Wiley-VCH.

S. Zamir, et al. "Lateral Confined Epitaxy of GaN Layers on Si Substrates" Journal of Crystal Growth (2001) pp. 341-345; vol. 230; Elsevier B.V.

Fr Hu, et al. "Molecular Beam Epitaxial Growth of GaN Thin Film on Si Substrate with InN as Interlayer" Journal of Crystal Growth 294 (2006) pp. 197-201; Elsevier.

* cited by examiner

GROUP III-NITRIDES ON SI SUBSTRATES USING A NANOSTRUCTURED INTERLAYER

CROSS-REFERENCE TO RELATED APPLICATIONS

This application incorporates claims benefit and incorporates by reference in its entirety Provisional Patent Application Ser. No. 60/712,922 entitled "GROUP III-NITRIDES ON SI SUBSTRATES USING A NANOSTRUCTURED INTERLAYER" filed on Aug. 31, 2005.

STATEMENT REGARDING FEDERALLY SPONSORED RESEARCH OR DEVELOPMENT

The United States Government may have certain rights in this invention pursuant to a grant from the U.S. Air Force grant number FA8650-04-2-1619.

BACKGROUND

GaN and related materials continue to grow in importance for optical and electronic devices. As in other semiconductor systems, epitaxial growth of GaN ideally occurs on GaN substrates cut from bulk GaN single crystals. Bulk crystal growth of GaN, however, requires extremely high pressure to maintain the nitrogen content in the crystal, rendering bulk growth extremely difficult. For this reason, the high volume production of large size, bulk GaN is improbable in the near future and the search for alternative substrates continues.

Two of the main factors associated with substrate choice are cost and resulting GaN epilayer quality. Silicon is increasingly being used as a substrate for GaN deposition because Si substrates are available at comparatively low cost, high quality, large area, and large quantity, thus presenting many manufacturing advantages over other available substrates for GaN, such as sapphire and SiC.

The disadvantages of Si as a substrate for GaN heteroepitaxy include an a-plane +20.5% misfit which led to the conclusion that growth of GaN directly on silicon was unfeasible. Moreover, the thermal expansion misfit between GaN ($5.6 \times 10^{-6}$ $K^{-1}$) and Si ($6.2 \times 10^{-6}$ $K^{-1}$) of 9.6% can lead to cracking upon cooling in films grown at high temperature, and, at elevated temperature, melt-back etching between Ga and the Si substrate during the initial stages of growth or at stress is known to induce cracks that form in GaN films during GaN deposition.

Traditionally these issues trigger polycrystalline GaN growth on Si substrates. Typically, thin AlN buffer layers are used to absorb the lattice mismatch between the GaN film and the Si substrate. The subsequent deposition of GaN introduces significant strain into the structure due the large lattice mismatch along with the resultant high density of defects that introduce additional tensile stress into the film. This tensile stress is exacerbated during cool down from growth temperature with macro-crack formation customary for GaN films thicker than 1 µm.

To overcome GaN cracking problems, different techniques have been used including use of multiple AlN interlayers, AlGaN graded layers, patterned Si, and in situ SiN masking (non-uniform deposition). These methods were reported to provide some decrease in bowing and cracking, but no method successfully produced crack-free thick (e.g. >10 µm) GaN films likely because there still remains excessive tensile stress, as well as strong cohesion between GaN (or AlN buffer layer) and Si. Although ~7 µm thick crack-free GaN on Si has been reported by incorporating multiple AlN interlayers, the maximum thickness of a commercially available crack-free GaN layer on Si is about 1 µm.

Cracks can be generated during growth or cooling due to the excess tensile stress caused by large lattice and thermal expansion differences. It has been observed by the present Inventors that the cracks penetrate through the Si substrate and separation occurs inside the Si substrate. The strong cohesion between GaN and Si (or AlN and Si in GaN/AlGaN/AlN/Si template case), as well as the brittleness of Si, are responsible for cracking to take place in pre interior of the Si wafer. The bond strength of Si—Si is 7 eV which is lower than and the Ga—N (8.9 eV) or Al—N (11.5 eV) and Si—N (10.5 eV). The bond strength of Si—Si is the weakest. The nano-indentation hardnesses of the GaN, AlN, and Si are 20, 18 and 14 GPa, respectively. Therefore, the cracking penetration to the Si substrate observed by the present Inventors was expected. This brittleness of Si added with the large tensile stress created by the lattice mismatch and thermal expansion differences makes the growth of crack-free GaN on Si even more challenging.

SUMMARY

A layered group III-nitride article comprises a single crystal silicon comprising substrate and a highly textured crystal group III-nitride layer disposed on the silicon substrate. The highly textured group III-nitride layer is crack free and has a thickness of at least 10 µm, such as 15 to 50 µm. As used herein, the term "highly textured" as applied to the group III-nitride layer refers to a layer which provides (i) a full width half maximum (FWHM) X-ray ω-scan rocking curve of no more than 20 arc-min, more preferably less than 10 arc-min, and most preferably less than 7 arc-min, and (ii) an XRD pole figure (Phi scan) that provides a highly non-uniform pole density that is clustered around the number of points characteristic of the particular orientation. For example, regarding the XRD, highly textured GaN will evidence only 2 peaks being at (002) and (004) in a LRXRD spectrum. Crack free is defined herein refers to an area of at least 25 $mm^2$ being "crack-free" as confirmed by SEM, AFM, or TEM.

The silicon substrate can be (111), (100) or other orientations. In a preferred embodiment, the highly textured group III-nitride layer comprises GaN. In this preferred embodiment, the article can further comprise a thin layer of a In—Ga—N alloy at an interface between the GaN layer and the silicon substrate.

A method for forming highly textured group III-nitride layers comprises the steps of providing a single crystal silicon comprising substrate, depositing a nanostructured $In_xGa_{1-x}N$ ($1 \geq x \geq 0$) interlayer on the silicon substrate, and depositing a highly textured group III-nitride layer on the interlayer. The interlayer has a nano indentation hardness that is less than both the silicon substrate and the highly textured group III-nitride layer. The group III-nitride layer can be GaN and the interlayer can be InN. The step of depositing a highly textured group III-nitride layer preferably comprises a first group III-nitride layer deposition at a first temperature followed by a second group III-nitride layer deposition at a second temperature, wherein the first temperature is below a decomposition temperature of the $In_xGa_{1-x}N$ ($1 \geq x \geq 0$) and the second temperature is at least 150° C. greater than the first temperature.

The highly textured group III-nitride layer is generally crack free and has a thickness of at least 10 µm. The nanostructured $In_xGa_{1-x}N$ ($1 \geq x \geq 0$) interlayer can comprise a columnar film or nanorods having an average rod diameter of 300 to 700 nm. The silicon substrate is preferably (111) oriented.

DETAILED DESCRIPTION OF THE INVENTION

It has been found by the inventors that a suitably nanostructured $In_xGa_{1-x}N$ ($1\geq x\geq 0$) interlayer relieves much of the stress at the Si substrate-group III-nitride film interface during group III-nitride film deposition and thus prevents crack formation during growth of thick ($\geq 1$ μm) group III-nitride films thereon. A layered group III-nitride article comprises a single crystal silicon comprising substrate and a highly textured crystal group III-nitride layer disposed on the silicon substrate. The highly textured group III-nitride layer is crack free and has a thickness of at least 10 μm, such as 15 to 50 μm.

The silicon substrate is preferably (111) oriented. However, the substrate can be other orientations, such as (100).

The structure of the nanostructured $In_xGa_{1-x}N$ ($1\geq x\geq 0$) interlayer used is preferably nanorods from 300 to 700 nm in diameter. Such nanorods are nanocrystalline single crystal dislocation free having a [00.1] growth axis.

In a preferred embodiment, the highly textured group III-nitride layer is selected from the group consisting of GaN, InN, AlN and their solid solutions. However, more generally, and other semiconductor materials, such as II-VI and IV-VI materials, as well as carbon nanotubes, can be disposed on the nanostructured interlayer.

The nanostructured $In_xGa_{1-x}N$ ($1\geq x\geq 0$) can comprise a plurality of crystalline nanorods, which can be randomly oriented or aligned with one another. A thickness of the nanostructured interlayer is generally from 0.1 to 3.0 μm.

A method for forming textured group III-nitride layers comprises the steps of providing a single crystal silicon comprising substrate, the silicon substrate preferably having a thin (native; about 15 to 20 angstrom) silicon dioxide layer disposed thereon, depositing a nanostructured $In_xGa_{1-x}N$ ($1\geq x\geq 0$) interlayer on the silicon substrate, and depositing a highly textured group III-nitride layer on the interlayer. Thus, in a preferred embodiment, the native oxide layer on the silicon substrate is not removed prior to depositing the nanostructured interlayer.

The interlayer growth generally is performed on the Si substrate at low temperature, such as T<600° C. The indium mole fraction can be varied to obtain a desired value in the entire compositional range ($0\leq x\leq 1$). In practice, different mole fractions of In can be controlled by varying the ratio of the inlet flow rate of an In comprising reagent, such as trimethyl indium (TMIn) to the total group III flow rate. When the Ga comprising reagent is triethyl gallium (TEGa), the total group III flow rate is the flow rate of TMIn plus TEGa, and the flow ratio noted above is (TMIn/[TMIn+TEGa]).

The step of depositing a highly textured group III-nitride layer can comprise a first group III-nitride layer deposition at a first temperature followed by a second group III-nitride layer deposition at a second temperature, wherein the second temperature is generally 150° C. greater than the first temperature. Two exemplary approaches are provided for the annealing procedure:

I: in situ slowly cooling down after the growth when reactor is off from the growth to room temperature, and II: after growth annealing in $N_2$ or $NH_3$ at the growth temperature (T=850 C, 15 to 30 min).

Free-standing III-Nitrides can also be grown using the invention by first depositing a nanostructured $In_xGa_{1-x}N$ ($1\geq x\geq 0$) at the interface along with a certain post grown annealing procedure. Free-standing as used herein refers to relatively thick ($\geq 50$ μm) film that is separated from the substrate.

The invention is expected to provide improved provide improved group III-nitride-based devices. For example, the invention can provide improved RF and microwave components for wireless industry, such as those based on high-electron mobility transistors (HEMTs).

EXAMPLES

It should be understood that the Examples described below are provided for illustrative purposes only and do not in any way define the scope of the invention.

In the Examples described below, two types of reactors were used to deposit GaN. The primary reactor used was a quartz hot-wall merged-hydride reactor that can alternate between MOCVD and HVPE. H-MOVPE has several advantages. The quick switching of precursors made it possible to grow InN nanorods and GaN without taking the wafers out from the reactor. It can also ease regulation of the amount of precursors which has been found to control the diameter, length, and density of the nanorods.

Si(111) substrates were cleaned by trichloroethylene, acetone, and methanol followed by DI water rinse and $N_2$ dry. Etching was purposely not carried out to take advantage of native oxide layer for nanorod growth. As used herein, the phrase "native oxide layer" refers to the silicon dioxide layer that forms on the surface of a silicon wafer from exposure to oxygen at or near room temperature.

It was believed that a thin native $SiO_2$ layer may help the nucleation of nanorods. After loading, the substrate was heated to 600° C. at a rate of 15° C./min. The precursors for the InN nanorod growth for the interlayer were trimethylindium (solution TMIn, Epichem), hydrogen chloride (10% HCl, 90% $N_2$, Air Products), and ammonia (grade 5 anhydrous $NH_3$, Matheson-Tri gas) with $N_2$ carrier gas. Reactor pressure P=760 Torr, T=600° C., $NH_3$/TMIn=250, HCl/

TMIn=4. Flow rates: TMIn=0.7 sccm; HN$_3$=175 sccm, HCl (10%)=28 sccm, N$_2$=1600 sccm.

After growth of the InN nanorods, the reactor was cooled and the low temperature (LT) GaN initial layer was deposited at 560° C. for 15 to 60 minutes with an approximate LT GaN thickness of thickness of 0.1-3.0 μm min. The temperature of the reactor was then increased to 850° C. after the LT-GaN growth. During the heating and cooling processes N$_2$ was always provided. High temperature (HT) GaN (850° C.) was subsequently grown on top of LT-GaN and thick GaN (>20 μm) was obtained without cracking. After growth, the reactor was cooled in N$_2$ ambient. The cooling rate was about −15° C./min.

Figure 1A:
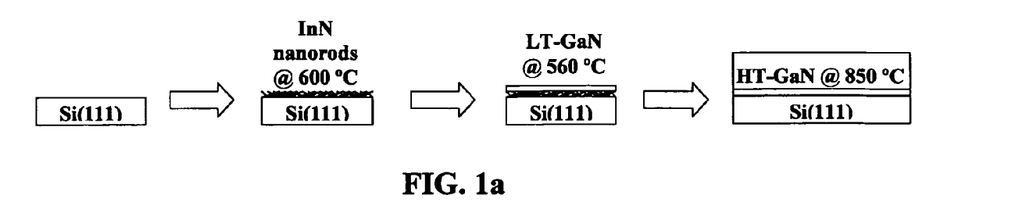
FIGS. 1(a) and (b) are schematic diagrams of an exemplary method according to the invention to grow thick, substantially crack-free, Group III-Nitrides film on Si substrates using a nanostructured interlayer (a) randomly oriented, and b) well aligned nanorods.
Figure 1B:
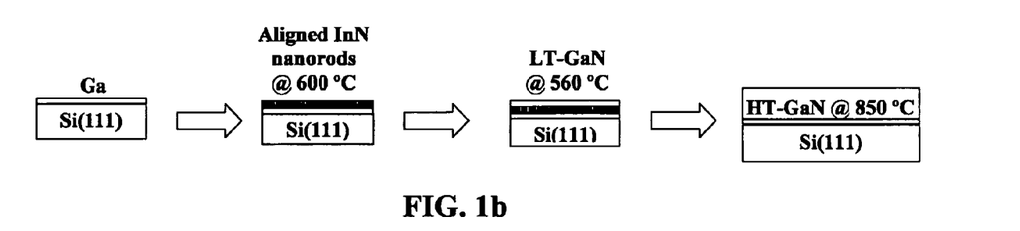
Figure 2:
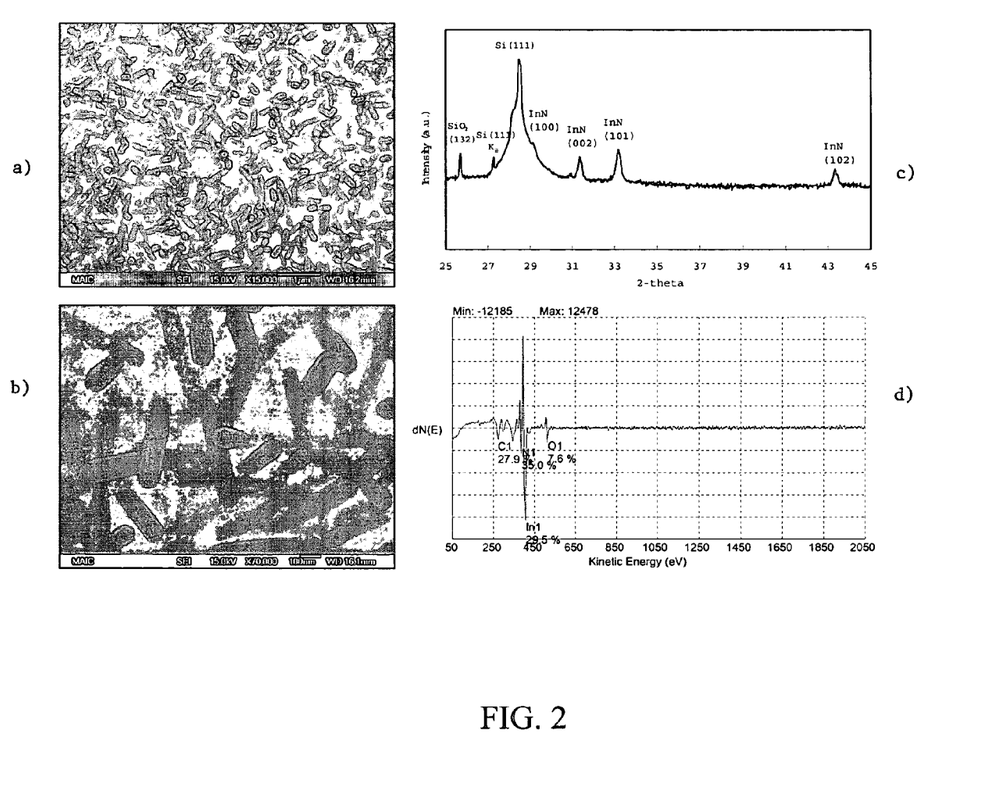
FIG. 2 shows InN nanorods grown by H-MOVPE on Si(111) at T=600° C.: a,b—scanned SEM images; c—LRXRD spectrum; d—AES spectrum.

FIGS. 2(a) and (b) are scanned SEM plane views of the deposited InN nanorods. The average diameter of InN nanorods was around 100 nm and the length was around 1 μm. Hexagonal, well-faceted features show that individual nanorods had very good crystal quality. An XRD θ-2θ scan shows typical InN crystal patterns with Si(111) substrate peak (see FIG. 2 (c)). A SiO$_2$ layer was observed by XRD. As noted above, the native oxide was intentionally not removed by etching to facilitate the nucleation of nanorods. Based on AES results shown in FIG. 2 d, the In:N ratio was determined to be 1:0.85. Carbon and oxygen were detected and origin was due to the chemosorption. No Cl was detected using the AES technique.

Figure 3:
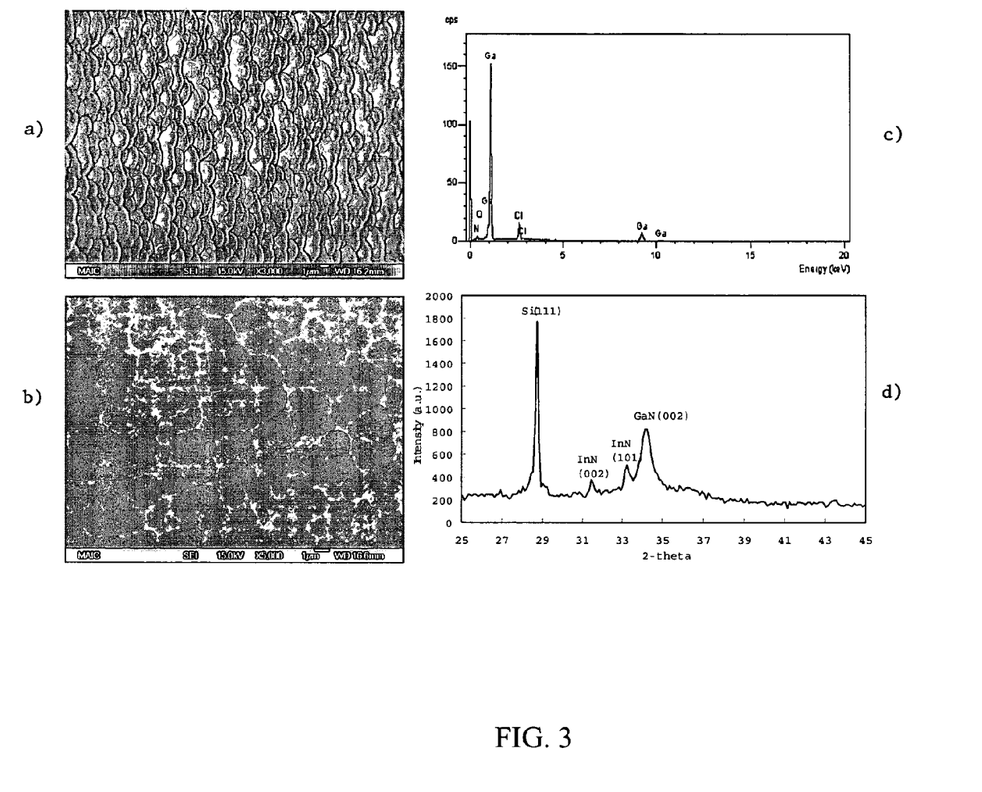
FIG. 3 shows LT-GaN deposited on top of InN nanorods on Si: a, b—SEM images; c—EDS spectrum, d—LRXRD spectrum.

FIG. 3 is a scanned SEM micrograph of LT-GaN grown on top of the InN nanorods. An interesting embossed pattern was observed. The diameter of the individual cell is around 1 μm, which is close to the length of InN nanorods. EDS results show the existence of elemental Cl. The growth temperature was 560° C., which is lower than the InCl$_3$ boiling temperature (586° C.). As a result InCl$_3$ may be formed during LT-GaN growth because excess HCl was provided as HCl/TMGa ratio=2. An XRD θ-2θ scan shows Si, InN, and GaN peaks that evidence the co-existence of InN nanorods and LT-GaN film.

Figure 4:
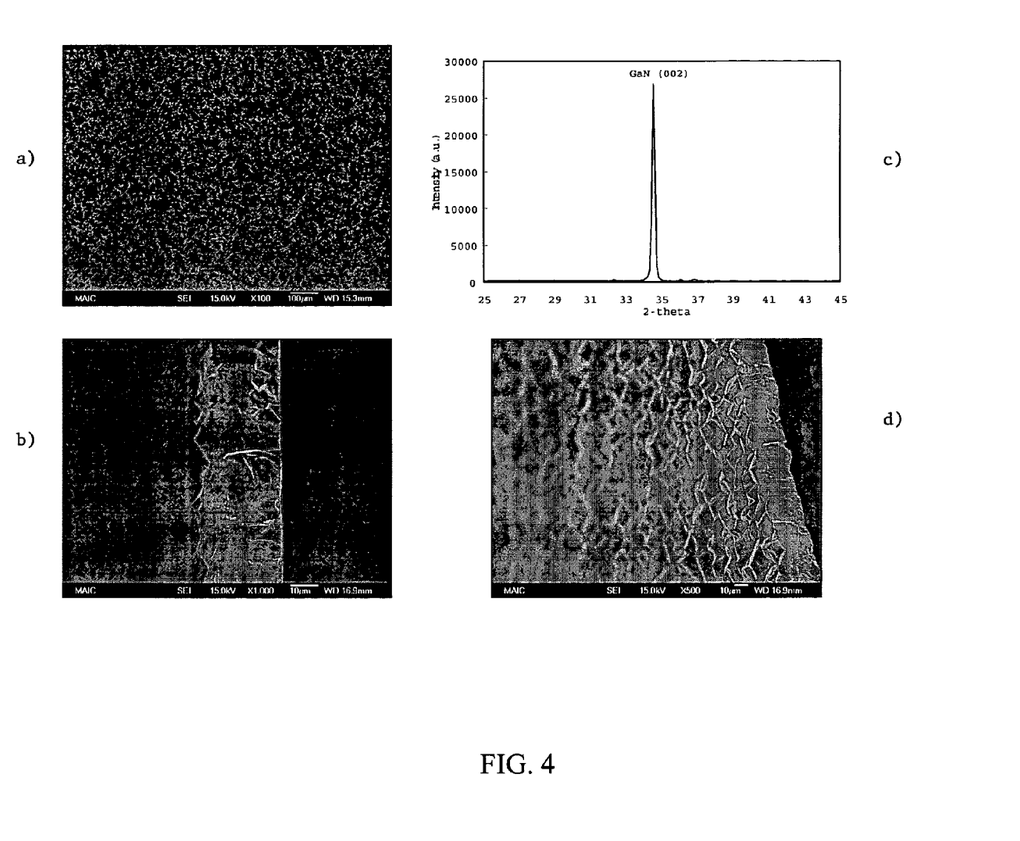
FIG. 4 shows a thick (28 μm) substantially crack free GaN grown on Si using nanorod interlayer: a—plane view scanned SEM image; b—scanned XSEM, c—LRXRD spectrum; d—free-standing GaN.

FIG. 4 is a scanned SEM showing crack-free 28.4 μm thick GaN film grown on a single crystal Si(111) wafer. No cracks were observed by SEM over the entire film as seen in FIG. 4 (b). High crystalline quality of the GaN film was demonstrated using XRD θ-2θ scan. The FWHM of GaN (002) peak was 341 arc sec. No Si(111) peak was detected due to screening by the thick GaN film.

Experiments regarding InN nanostructured buffer growth on Si is now described. InN columnar film, small nanorods (d=250 nm), large nanorods (d=500 nm), and microrods were grown on Si substrates at different conditions listed in the Table below and used as templates for thick GaN growth.

| Growth conditions for InN buffer interlayer on Si. | | | | |
|---|---|---|---|---|
| Growth T (° C.) | Cl/In | N/In | Time | Feature |
| 560 | 1 | 2500 | 1 hr | (a) Columnar Film |
| 600 | 4 | 250 | 20 min | (b) Nanorods (d = 250 nm) |
| 600 | 4 | 250 | 1 hr | (c) Nanorods (d = 500 nm) |
| 650 | 5 | 250 | 1 hr | (d) Microrods |

Experiments regarding low-temperature GaN growth on InN nano/Si templates are now described. Low temperature (560° C.)-GaN was grown on the 4 different InN interlayers/Si for comparison of the structural effects of InN. LT-GaN was grown on various InN crystals for 10, 20, and 30 min. The growth conditions for LT-GaN were set as T=560° C., Cl/In=1.5, and N/In=570. It was observed that only InN columnar films and larger nanorods (d=500 nm) provided uniform coverage of LT-GaN, while the smaller nanorods (d=250 nm) and microrods demonstrated non-uniform coverage of LT-GaN. It was found that GaN deposition occurred mainly on the InN surface, rather than on the Si substrate.

Figure 5:
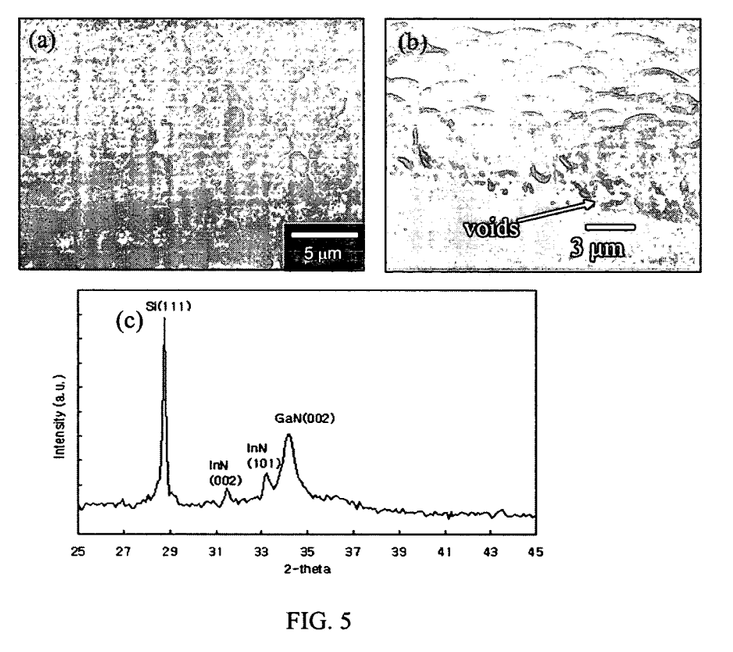
FIG. 5(a) shows a wide area scanned SEM plan-view of 30 min LT-GaN grown on InN nanorods.
FIG. 5(b) is a scanned cross-sectional view that shows that the thickness of the LT-GaN was ~4 μm and that voids were formed at the interface.
FIG. 5(c) is an XRD θ-2θ scan showing GaN (002), InN (002), and InN (101) peaks, as well as the Si (111) substrate peak.

FIG. 5(a) shows a wide area scanned SEM plan-view of 30 min LT-GaN grown on InN nanorods. LT-GaN started to coalescence after 30 min, and an interesting embossed pattern could be seen. The scanned cross-sectional view (FIG. 5(b)) shows that the thickness of the LT-GaN was ~4 μm and that voids were formed at the interface. XRD θ-2θ scan (FIG. 5(c)) showed GaN (002), InN (002), and InN (101) peaks, as well as the Si (111) substrate peak. This data shows that InN nanorods still exist after 30 min LT-GaN growth. This was expected since 560° C. is well below the decomposition temperature of InN. No In metal was detected by the XRD.

High-temperature GaN growth on LT-GaN/InN/Si(111) then followed. Thick GaN films were grown at 850° C. for 2 hr after the 30 min LT-GaN growth on InN crystals described above. The growth conditions for HT-GaN were as follows: Cl/Ga=1.5, N/Ga=570, and T=850° C. N$_2$ was used as the carrier gas. Thick GaN films having a thickness of about 20 μm were deposited. Thick (about 20 μm) GaN films were grown on LT-GaN for each of an InN columnar film, small InN nanorods (d=250 nm), large InN nanorods (d=500 nm), and InN microrods. Thick GaN grown on the InN columnar film/Si showed significant peeling of the GaN film, but no cracks. Thick GaN grown on smaller InN nanorods (d=250 nm) over Si(111) showed cracks likely due to the non-uniform deposition of InN nanorods and LT-GaN. Thick GaN film on InN microrods on Si showed cracks.

The best result for crack-free thick GaN was found for growth on the large InN nanorod (d=500 nm) interlayer. Although the surface was found to be is still rough, the data obtained makes it clear that dense and uniform InN nanorods can provide a good structure for thick, crack-free GaN growth on Si(111).

Figure 6:
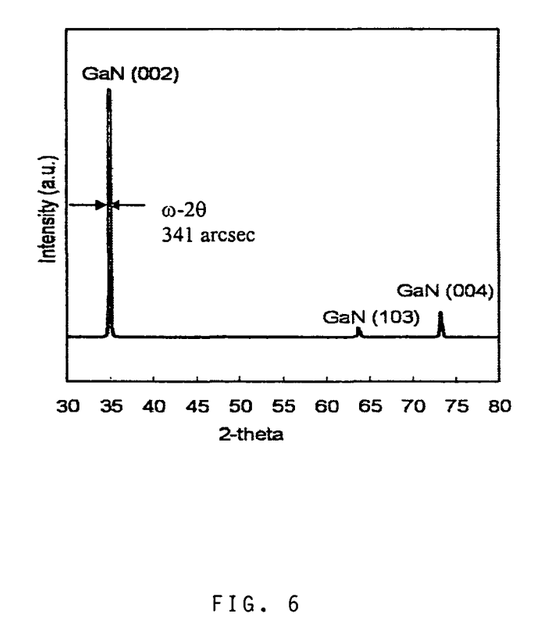
FIG. 6 is a low resolution XRD θ-2θ of freestanding and crack-free GaN film (28 μm thick) grown on InN nanorods (d=500 nm)/Si (111) substrates according to the invention. The low resolution XRD shows GaN (002), (004), and (103) peaks. No InN was detected.

The GaN film occasionally self-separated from the Si substrates without effort. SEM and XRD were obtained for freestanding and crack-free GaN film (28 μm thick) grown on InN nanorods (d=500 nm)/Si (111) substrates. No cracks were observed by SEM over the wide range of the film. Low resolution XRD shown in FIG. 6 shows GaN (002), (004), and (103) peaks. No InN was detected presumably because at the growth temperature (850° C.), the InN dissolved into the In$_x$Ga$_{1-x}$N. The film was polycrystalline, but highly textured along the [002] axis with an FWHM of 341 arcsec.

A cross-sectional SEM view of crack-free thick (40 μm) GaN grown on Si substrate using dense and large (d=500 nm) InN nanorods was obtained. In this case, self-separation did not occur. InN nanorods at the interface were not visible after HT-GaN. InN likely dissolved into GaN to form In$_x$Ga$_{1-x}$N alloy at the interface.

This invention can be embodied in other forms without departing from the spirit or essential attributes thereof and, accordingly, reference should be had to the following claims rather than the foregoing specification as indicating the scope of the invention.

What is claimed is:

1. A layered group III-nitride article, comprising:
    a single crystal silicon comprising substrate;
    a nanostructured interlayer; said nanostructured interlayer comprising a nanostructured feature selected from the group consisting of a columnar film, a plurality of nanorods, a plurality of microrods, and a combination thereof;
    and a highly textured crystal group III-nitride layer, said highly textured group III-nitride layer being crack free and having a thickness of at least 10 μm wherein said nanostructured interlayer is disposed between said silicon substrate and said highly textured group III-nitride layer.

2. The article of claim 1, wherein said silicon substrate is (111) or (100) oriented.

3. The article of claim 2, wherein said highly textured group III-nitride layer comprises GaN.

4. The article of claim 3, wherein said interlayer comprises an InGaN alloy.

5. The article of claim 1, wherein said nanostructured interlayer comprises nanorods, microrods, or a combination thereof.

6. The article of claim 1, wherein said nanostructured interlayer comprises nanorods, said nanorods being well aligned.

7. The article of claim 1, wherein said nanostructured interlayer comprises nanorods, said nanorods being randomly oriented.

8. The article of claim 1, wherein said nanostructured interlayer comprises nanorods, said nanorods having an average rod diameter of 300 to 700 nm.

9. The article of claim 1, wherein said nanostructured interlayer comprises nano rods, said nanorods comprising InN.

10. The article of claim 1, wherein said nanostructured interlayer comprises $In_xGa_{1-x}N$, wherein $1>x>0$.

11. The article of claim 1, wherein said nanostructured interlayer has a thickness of 0.1 to 3.0 μm.

12. The article of claim 1, wherein said silicon substrate is (111) oriented.

* * * * *